United States Patent
Ligozat et al.

(10) Patent No.: US 9,571,761 B2
(45) Date of Patent: Feb. 14, 2017

(54) IMAGE-SENSING METHOD HAVING A VERY SHORT INTEGRATION TIME

(71) Applicant: E2V Semiconductors, Saint-Égrève (FR)

(72) Inventors: Thierry Ligozat, Quaix en Chartreuse (FR); Bruno Diasparra, Seyssinet (FR)

(73) Assignee: E2V SEMICONDUCTORS, Saint Egreve (FR)

( * ) Notice: Subject to any disclaimer, the term of this patent is extended or adjusted under 35 U.S.C. 154(b) by 79 days.

(21) Appl. No.: 14/646,037

(22) PCT Filed: Nov. 6, 2013

(86) PCT No.: PCT/EP2013/073196
§ 371 (c)(1),
(2) Date: May 20, 2015

(87) PCT Pub. No.: WO2014/082827
PCT Pub. Date: Jun. 5, 2014

(65) Prior Publication Data
US 2015/0304577 A1    Oct. 22, 2015

(30) Foreign Application Priority Data
Nov. 27, 2012    (FR) ...................................... 12 61271

(51) Int. Cl.
*H04N 5/335* (2011.01)
*H04N 5/353* (2011.01)
(Continued)

(52) U.S. Cl.
CPC ...... *H04N 5/3535* (2013.01); *H01L 27/14643* (2013.01); *H04N 5/2226* (2013.01);
(Continued)

(58) Field of Classification Search
CPC .................................................. H04N 5/3535
See application file for complete search history.

(56) References Cited

U.S. PATENT DOCUMENTS

| 7,940,316 B2 | 5/2011 | Cieslinski |
| 2010/0026823 A1 | 2/2010 | Sawada |

(Continued)

FOREIGN PATENT DOCUMENTS

| EP | 1708496 A2 | 10/2006 |
| EP | 1742369 A2 | 1/2007 |
| WO | 00/19705 A1 | 4/2000 |

OTHER PUBLICATIONS

International Search Report for PCT/EP2013/073196, dated Nov. 12, 2013.

*Primary Examiner* — Gary C Vieaux
(74) *Attorney, Agent, or Firm* — Hauptman Ham, LLP

(57) ABSTRACT

The invention relates to image sensors, and more particularly to matrix sensors having active pixels in CMOS technology. According to the invention, a method for imaging a scene with a very short integration time, by using a standard image sensor comprising a matrix of pixels, comprising photodiodes, and charge storage nodes, is provided. Two images of the same scene are produced under identical light conditions, one of the images corresponding to integration of charges during a first time interval with a duration $T_{int}$ and the other image corresponding to a second time interval with a duration $T'_{int}$ longer than $T_{int}$, and a difference between these two images is established, representing an image integrated during a time interval $T'_{int}-T_{int}$. The light may be provided by a light pulse (IMP). This method may be used for observing points in a scene that lie at a well-determined distance, the brevity of the integration time allowing good precision of the observation distance.

7 Claims, 4 Drawing Sheets

(51) Int. Cl.
*H04N 5/222* (2006.01)
*H01L 27/146* (2006.01)
*H04N 5/374* (2011.01)
*H04N 5/378* (2011.01)

(52) U.S. Cl.
CPC ............ *H04N 5/353* (2013.01); *H04N 5/374* (2013.01); *H04N 5/378* (2013.01)

(56) References Cited

U.S. PATENT DOCUMENTS

2011/0134290 A1  6/2011  Park et al.
2012/0188404 A1  7/2012  Muukki et al.

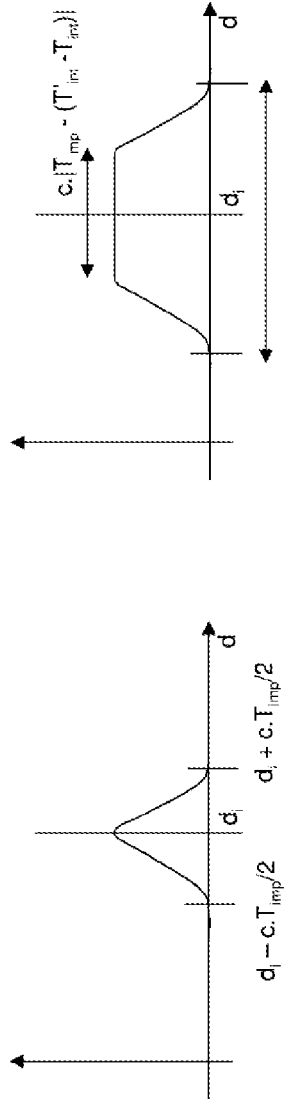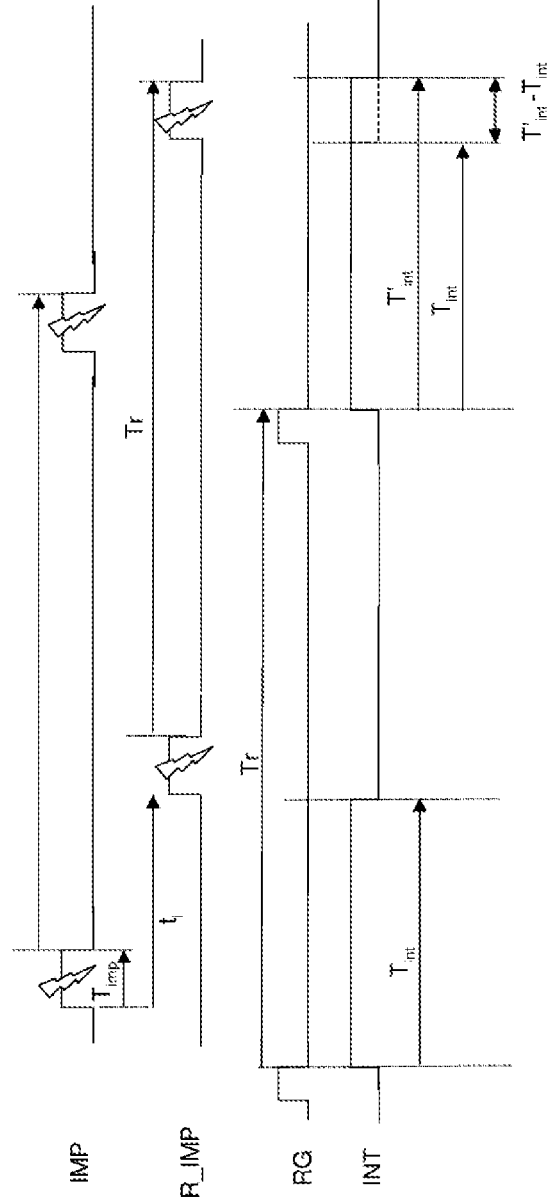

IMAGE-SENSING METHOD HAVING A VERY SHORT INTEGRATION TIME

FIELD

The invention relates to image sensors, and more particularly to matrix sensors having active pixels in CMOS technology.

BACKGROUND

Current technology makes it possible to produce sensors in which the integration duration of the electric charges generated by light in the pixels can vary between a few hundreds of nanoseconds and twenty milliseconds (or more if a reduction of the rate of the images to less than 50 images per second is accepted). It is difficult to reduce the integration duration below 100 or 200 nanoseconds; the reason is that the sequencing of the operation of a sensor is established by synchronous logic circuits; it would not be possible to reduce the durations of the synchronous signals below about one hundred nanoseconds securely.

There could, however, be a need to take images with an even shorter integration duration. This may be the case, for example, if the intention is to use the sensor, by combining it with a pulsed light source, in order to measure distances or to take an image of a scene at a given distance. This measurement or control of the distance of the observed scene is based on knowledge of the time of flight of the light between the source and the sensor after reflection from a point in the scene being observed. It therefore relies at least partly on good synchronization between the moment when a light pulse is sent and the moment when the charges generated by the return of this light pulse onto the sensor are integrated. The precision of the measurement or of the control of the distance may depend in particular on the integration duration of the charges generated by the light pulse. Typically, a duration of 100 nanoseconds corresponds to a distance of 30 meters travelled by the light, but there may be a desire to benefit from a shorter integration duration in order to improve the precision of the measurement or of the distance control.

SUMMARY

It is therefore an object of the invention to provide a method for making it possible in general to produce an image with a very short integration time, and to do so with a sensor in ordinary technology.

According to the invention, a method is provided for imaging a scene with a very short integration time by using an image sensor comprising a matrix of pixels, each pixel comprising a photodiode and means for reading the charges accumulated by the photodiode during an integration duration, the matrix furthermore comprising sequencing means for establishing start and end instants of the integration duration, the method being characterized in that two images of the same scene are produced under identical light conditions, one of the images corresponding to integration of charges during a first time interval with a duration $T_{int}$ and the other image corresponding to a second time interval with a duration $T'_{int}$ longer than $T_{int}$, and a difference between these two images is established, representing the equivalent of an image integrated during a time interval $T'_{int}-T_{int}$.

Although the integration durations $T_{int}$ or $T'_{int}$ cannot be reduced to very low values, for example less than 100 nanoseconds, their difference may be very small, for example of the order of 1 to 10 nanoseconds, and an image equivalent to that which would be obtained with a very short integration time is therefore produced by taking the difference.

The difference between the two images may be a pixel-to-pixel difference between the luminances provided by the same pixel in two full images taken successively under the same conditions. It is then necessary that the scene has not changed between the two images.

Alternatively, the two images may be partial images taken from a single full image; the partial images are respectively the image of the odd rows and the image of the even rows of the matrix; the difference between the images is the pixel-to-pixel difference between the luminances of the corresponding pixels of an odd row and the luminances of the pixels of an even row immediately adjacent. Half the vertical resolution of the image is lost, but it is certain that the scene being observed has not changed between the two images.

In one embodiment of the invention, the observed scene is illuminated by a light pulse which replaces or supplements continuous illumination (natural or artificial) of the scene.

In this case, the method uses not only the image sensor but also a controlled light source providing light pulses calibrated in duration and in time intervals in synchronism with the operation of the sensor. The light may be visible or near-infrared light, to which silicon sensors are sensitive. Two images of the same observed scene, illuminated by a single light pulse or by two identical successive light pulses, are then produced, but with two slightly different integration times.

In one particular application, intended for observing points in the scene that lie at a determined distance or intended for controlling the distance to a scene or a point, light pulses are used and the integration durations $T_{int}$ and $T'_{int}$ are synchronized with respect to the light pulse (or the two light pulses) in a way which will be detailed below. Overall, this synchronization consists in making the light pulse reflected by a point at a determined distance $d_i$ overlap (partially or fully) the portion of duration $T'_{int}$ which extends beyond (or before) the duration $T_{int}$. The more or less full coincidence between the reflected pulse and this duration portion makes it possible to determine whether or not a point in the observed scene lies at the distance $d_i$, with a precision which is commensurately greater when the duration of the light pulse and the duration of the difference $T'_{int}-T_{int}$ are smaller.

In the case in which there are two successive light pulses offset in time by a frame duration $T_r$, one associated with integration during the duration $T_{int}$ and the other associated with integration during a duration $T'_{int}$ offset in time by the value $T_r$, the coincidence mentioned above is of course a coincidence obtained after offset of $T_{int}$ by a duration $T_r$, since $T_{int}$ and $T'_{int}$ lie in different frames.

BRIEF DESCRIPTION OF DRAWINGS:

Other characteristics and advantages of the invention will become apparent on reading the following detailed description, which is given with reference to the appended drawings, in which:

FIG. 6 represents a difference signal obtained as a function of the distance between a point in the scene and the sensor around a determined distance $d_i$;

FIG. 7 represents a difference signal when the duration of the light pulse and the integration duration ($T'_{int}$–$T_{int}$) are not equal;

FIG. 8 represents a time diagram of synchronization between the light pulses and the integration instants in the case in which the difference is formed between images obtained during two successive frames.

DESCRIPTION OF EMBODIMENTS

Figure 1:
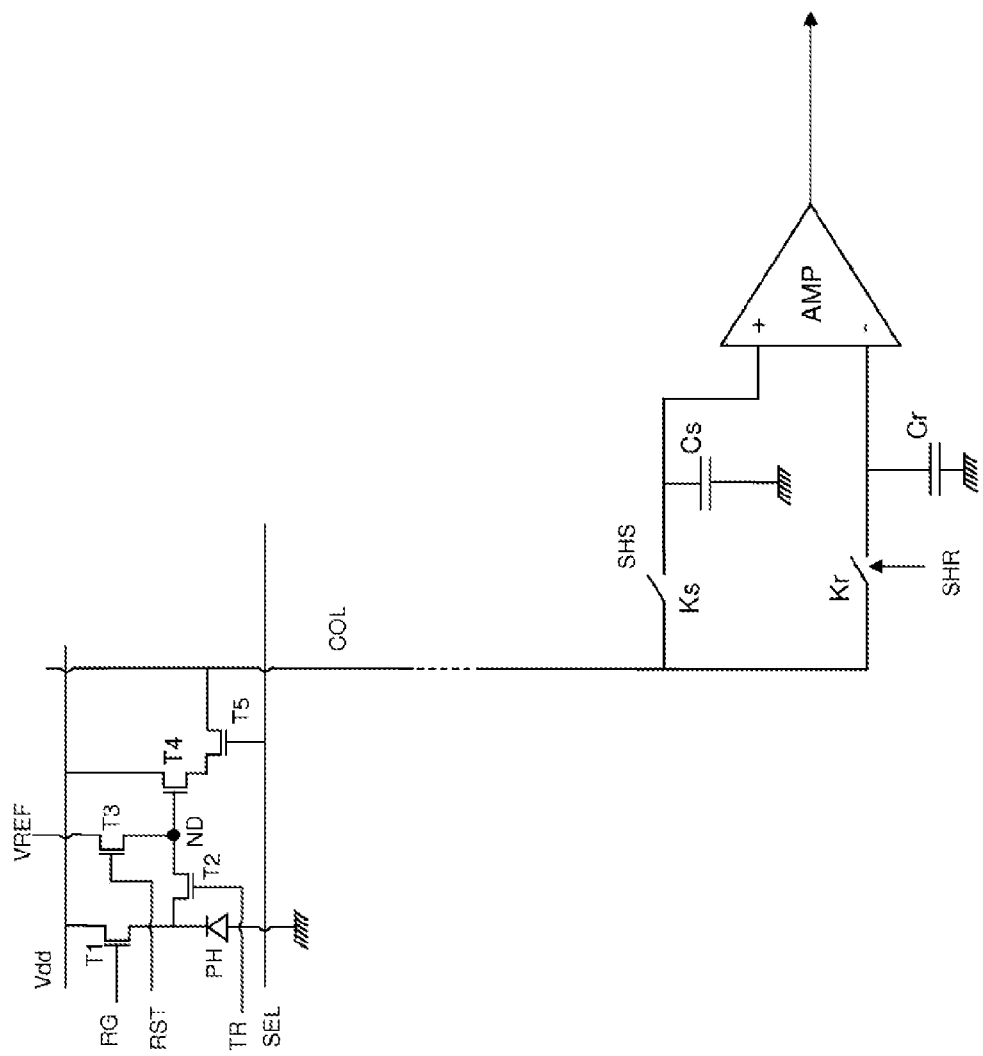
FIG. 1 represents the structure of a pixel and its reading circuit for implementation of the invention.

FIG. 1 represents the general structure of a pixel and of the part of the reading circuit outside the matrix of pixels. The method according to the invention may, for example, be implemented with an image sensor comprising a matrix of pixels of this type, produced in CMOS technology.

The pixel conventionally comprises a photodiode PH and a charge storage node ND, in which the charges generated by the photodiode during an integration time $T_{int}$ can be stored. The pixel furthermore comprises a plurality of MOS transistors, which are used to control it in order to define the integration time and to extract a signal representing the quantity of charge stored during this integration time.

More precisely, the pixel comprises:
a transistor T1 which makes it possible to reinitialize the potential of the photodiode before starting a new integration period of duration $T_{int}$; this transistor is controlled by a global reinitialization signal RG common to all the pixels of the matrix; the end of the signal RG defines the start of the integration duration $T_{int}$.
a charge transfer transistor T2 which makes it possible to empty the charges generated after an integration duration $T_{int}$ into the storage node ND; this transistor is controlled by a charge transfer signal TR which may be common to an entire row of pixels of the matrix and even to a plurality of rows or all the rows; the end of this signal defines the end of the integration duration $T_{int}$,
a reinitialization transistor T3 which makes it possible to reinitialize the potential of the storage node after reading of the quantity of charge which was stored therein; this transistor is controlled by a reinitialization signal RST which may be common to all the pixels;
a read transistor T4 which is connected as a voltage follower and which makes it possible to transfer the potential level of the charge storage node from its gate to its source;
and lastly, a selection transistor T5 which is connected to the source of the transistor T4 and which makes it possible to transfer the potential of the charge storage node to a column conductor COL (common to the pixels of a given column of the matrix) when the intention is to read the quantity of charge stored in the charge storage node; this transistor is controlled by a row selection signal SEL common to all the pixels of a row; the pixels are read row by row and there is therefore a respective selection $SEL_i$ signal for the row of rank i, this signal not overlapping the selection signals of the other rows.

The read circuit, which is external to the matrix of pixels and is connected to the various column conductors, comprises a sampling circuit for each column The sampling circuit samples the potential of the column conductor, for example from two capacitors Cr and Cs, with the aid of switches Kr and Ks, respectively at an instant when the storage node has been reset and at an instant when the intention is to determine the quantity of charges accumulated in the storage node. The difference between the potentials sampled from the capacitors represents the quantity of charge accumulated. It may be read by a differential amplifier AMP then digitized, or directly digitized, for example with the aid of a counter, a linear voltage ramp and a comparator.

The set of digital signals collected for all the pixels of the matrix, read successively row by row, constitutes an image of the scene. This image may be decomposed into two partial images if the even rows and the odd rows are read separately.

Figure 2:
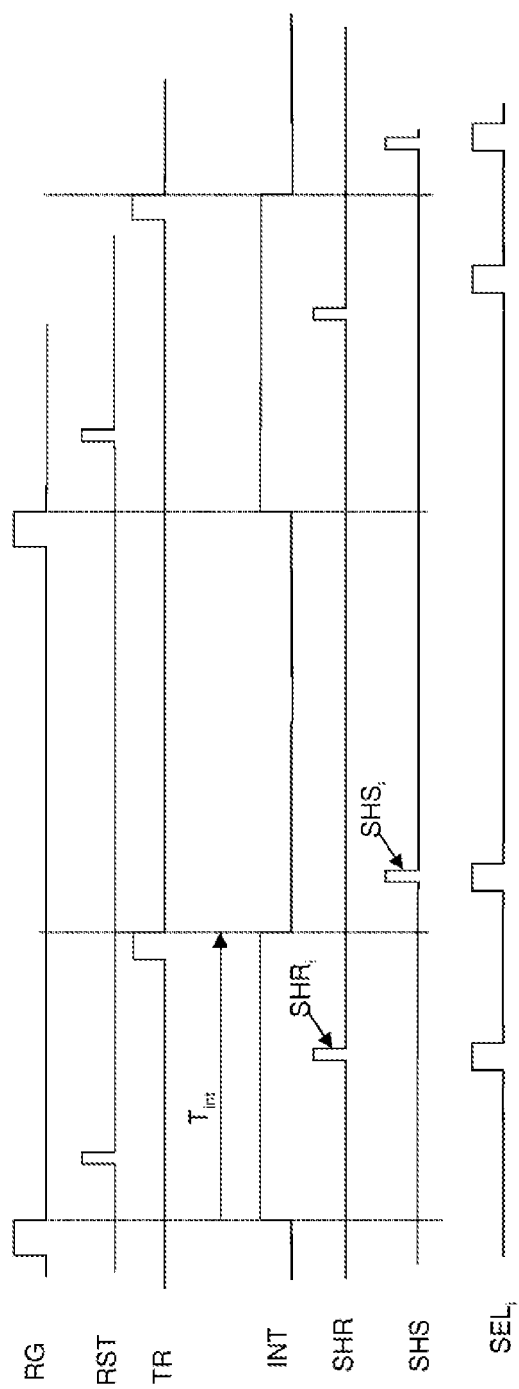
FIG. 2 represents a conventional time diagram defining the charge integration duration in a pixel and the reading of these charges.

FIG. 2 explains a conventional time diagram of operation, showing how the integration duration of the pixel described in this way can be defined and regulated. The following can be seen:
Control signals of the pixel:
the global reinitialization signal RG, the end of which defines the start of the integration duration $T_{int}$ during which the photodiode of the pixel can integrate charges; the signal RST maintains the potential of the photodiode at a fixed value so long as it is present, and it prevents the charge integration;
the reinitialization signal RST, which reinitializes the potential of the storage node ND to a fixed value with a view to reading this potential before the storage node is filled with charges coming from the photodiode;
the transfer signal TR, by which the charges generated by light in the photodiode during the integration duration are transferred to the charge storage node ND.

The signals RG, RST and TR may be common to all the rows of pixels of the matrix.

The line INT in FIG. 2 does not represent a control signal, in contrast to the other lines; rather, it represents the definition of the integration duration $T_{int}$ which it can be seen starts at the end of the signal RST and ends at the end of the signal TR. Reference will be made below to the time window INT for simplicity, rather than to the signals RG and TR which determine it.

Read signals:
sampling signal SHR; this samples from the capacitor Cr the output potential level of the pixel, which is present on the column conductor COL after the storage node is reinitialized by the signal RST and before transfer of charges by the signal TR; N.B. only the signal $SHR_i$ corresponding to the reading of the row of rank i is represented, but in reality a succession of signals SHR are emitted between the signal RST and the signal TR, each signal SHR corresponding to a respective row;
sampling signal SHS; this samples from the capacitor Cs the output potential level of the pixel, which is present on the column conductor COL after the end of the charge transfer signal TR; N.B. only the signal $SHS_i$ corresponding to the reading of the row of rank i is represented, but in reality a succession of signals SHS is emitted after the signal TR;

signal $SEL_i$ selecting the pixels of the row of rank i for the reading of these pixels; the signal $SEL_i$ is established for a first time during the emission of the signal $SHR_i$ corresponding to this row, then for a second time during the emission of the signal $SHS_i$ corresponding to the same row.

The signals SEL corresponding to the various rows are emitted successively without mutual overlap.

According to the invention, it is proposed to take two images of the same scene but with two very slightly different integration times $T_{int}$ and $T'_{int}$; the difference of the images is then formed, this difference representing the equivalent of integration during a very short duration $T'_{int}$-$T_{int}$. This difference is of course shorter than the duration $T_{int}$, since the desire is to obtain an equivalent integration time shorter than that which the sensor could normally establish. The duration $T_{int}$ is itself a duration that is as short as possible in relation to the synchronous sequencing possibilities of the sensor.

Figure 3:
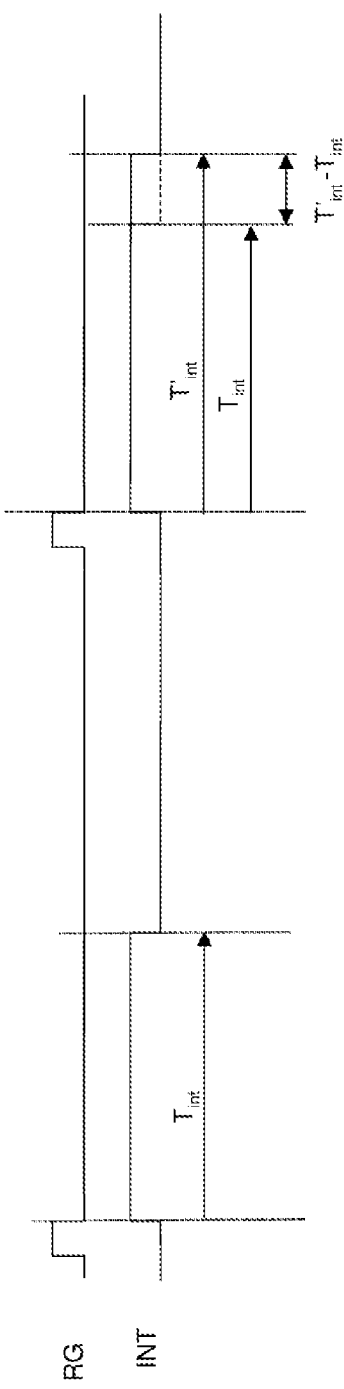
FIG. 3 represents the principle of obtaining two successive images during two frames, with different integration durations in the two frames.

FIG. 3 represents the time diagram in the case in which two successive images are taken, the scene being assumed to be unchanged between the two images.

The signals of the two images, representing luminances received by the pixels during respective durations $T_{int}$ and $T'_{int}$, are subtracted pixel by pixel, and the difference image which results therefrom is the same as that which could have been obtained with a very short integration time if that could have been done. In one example, the sensor is capable of producing an integration time of the order of 100 nanoseconds but not shorter. It is, however, capable of producing two different integration times respectively of 100 nanoseconds and 110 nanoseconds. The difference of the images corresponds to an integration time of 10 nanoseconds, which the sensor could not have produced directly.

Figure 4:
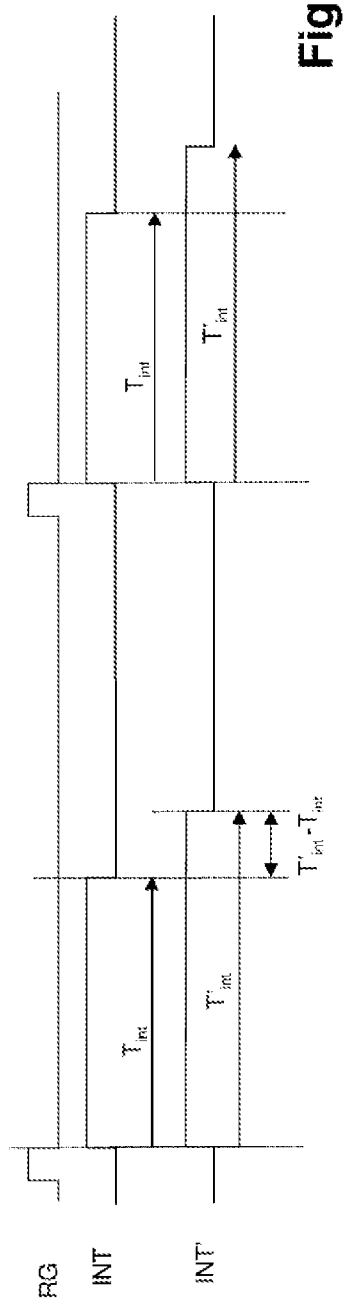
FIG. 4 represents a time diagram of the obtaining of two partial images with two different respective integration durations during a single frame.

In order to produce two different integration times having this small difference of 10 nanoseconds, asynchronous logic with logic gates and delay logic circuits will be used. The delay produced by a simple CMOS inverter is of the order of one nanosecond. With asynchronous logic circuits using such inverters, it is therefore possible to produce logic signals with slightly different durations $T_{int}$ and $T'_{int}$, even though the duration of the signal cannot decrease below a certain limit FIG. 4 represents the time diagram in an alternative embodiment in which the two images of the same scene, obtained with two different integration times, are similar partial images taken at the same moment. One way of obtaining them is to produce two interlaced images, the first image being obtained by all the odd rows of the matrix and the second image being obtained by all the even rows. The difference is formed pixel by pixel between two adjacent rows. There is a loss of vertical resolution since the partial images contain two times fewer rows, but the difference image is obtained in a single image frame and not in two successive frames.

The line INT of FIG. 4 represents the integration time for the odd rows. The line INT' represents the integration time for the even rows. In this case, a first signal for transfer of charges of the photodiodes to the charge storage nodes is produced and applied only to the pixels of the odd rows, and another transfer signal is produced and applied only to the pixels of the even rows, while in the case of FIG. 3 the transfer signal is applied to the entire matrix. The reinitialization signal RST may be applied in common to the even and odd rows or separately to the even and odd rows.

In one embodiment of the method according to the invention, the illumination of the scene is pulsed illumination. The difference between two images of the same scene, which are obtained by identical pulsed illumination, is observed. In one case, the pulsed light source provides a single pulse and the difference is formed pixel by pixel between the even and odd rows, as indicated above; in another case, the light source provides two pulses separated by the duration of a frame and the difference is then formed pixel by pixel between the two full images obtained during two successive frames.

A particular application of integration during a very short time by difference between two images, in the presence of illumination by light pulses, is the obtaining of an image of the points of the scene which lie at a determined distance $d_i$ from the sensor, and only of these points, with a high precision for this distance.

To this end, light pulses that are very short in relation to the integration duration $T_{int}$ are emitted, preferably pulses whose duration is equal to or approximately equal to the difference $T'_{int}$-$T_{int}$.

Figure 5:
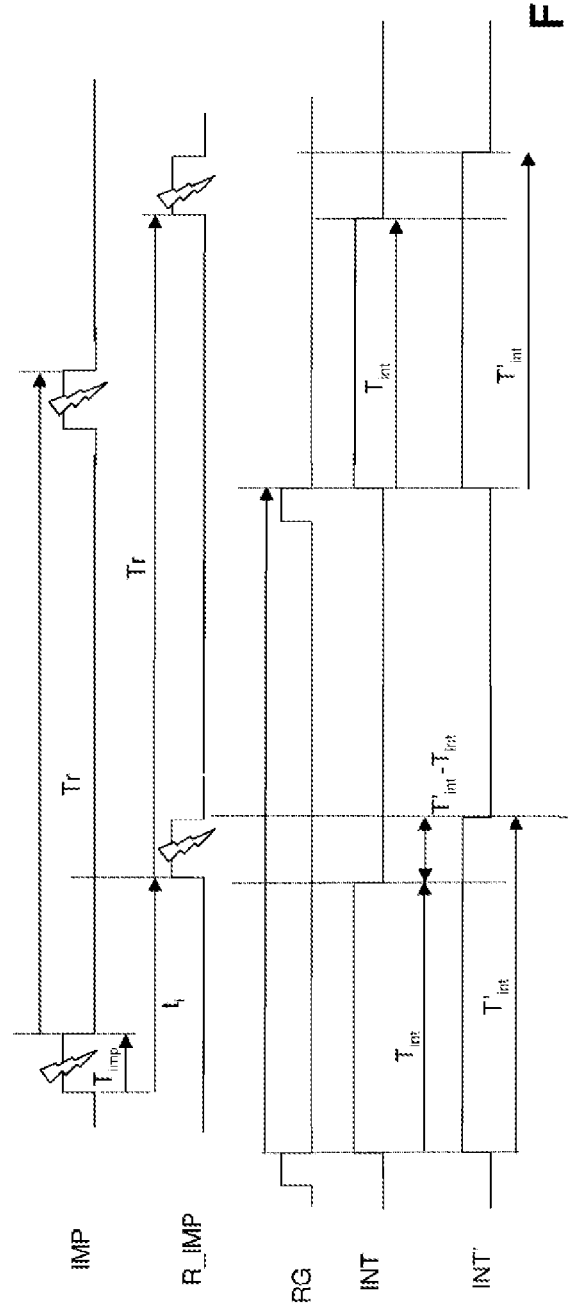
FIG. 5 represents the synchronization between light pulses emitted and the start and end instants of the integration of charges for observation of points lying at a determined distance $d_i$.

FIG. 5 represents the time diagram of operation in the case in which a difference of two partial images taken during the same frame with a single light pulse is produced, with the intention of observing the points of the scene which lie at a well-determined distance $d_i$.

A succession of pulses are emitted with a period Tr, which is the frame period of the sensor. For each pulse, and therefore for each frame, two partial images are established and their difference is formed: the image of the even rows and the image of the odd rows. The light pulse (line IMP in FIG. 5) emitted at a given instant by the source is reflected (line R_IMP) by a point of the scene which lies at a distance $d_i$ (the one which is intended to be observed) and reaches the sensor with a time offset $t_i$ that depends on the distance of this point. In general, if the source and the sensor lie at the same position, the time $t_i$ is equal to $2d_i/c$, c being the speed of light. The operation of the sensor is synchronized with that of the light source which emits the pulses: the frame start of the sensor (determined by the end of the reinitialization signal RG) is emitted at a precise instant in relation to the instant at which the light pulse is emitted, taking into account the integration durations $T_{int}$ and $T'_{int}$, so that the portion of duration $T'_{int}$ which continues beyond the duration $T_{int}$ corresponds to the moment at which the return pulse R_IMP arrives.

The reinitialization signal RG and the transfer signals TR are therefore synchronized in such a way that the reflected light pulse R_IMP coincides with the portion of duration $T'_{int}$ that does not coincide with the duration $T_{int}$. In an ideal simplified situation, the duration $T_{imp}$ of the light pulse is approximately equal to the duration $T'_{int}$-$T_{int}$, and the reflected light pulse R_IMP is exactly set on the portion of duration $T'_{int}$-$T_{int}$ when the point of reflection is exactly at the distance $d_i$. In this case, it will be understood that the first image, integrated during the duration $T_{int}$, does not provide a signal associated with the reflected light pulse since the latter arrives too late, after the integration duration $T_{int}$, in contrast, the second image, integrated during the longer duration $T'_{int}$, does provide a signal in response to the reflected light pulse. The difference of the images for a given pixel is therefore directly associated with the presence of a point at the distance $d_i$ in the observed scene.

A curve of the signal resulting from this distance can be plotted as a function of the real distance d between the point of the scene and the sensor around the theoretical value $d_i$ for which the synchronization is exact. FIG. 6 represents such a curve.

The signal resulting from the difference is firstly zero if the distance d is too short: the light pulse R_IMP arrives too soon and ends before the end of the duration $T_{int}$; the two images integrate the same quantity of light and their difference is zero. The signal then increases because the second image continues to receive the light pulse while the first image receives less and less of it as the distance d approaches the value $d_i$; the difference signal then reaches the maximum when the pulse R_IMP coincides with the time interval $T'_{int}-T_{int}$. Lastly, the difference signal decreases when the distance d exceeds $d_i$, and it finally becomes zero when the return pulse R_IMP arrives after the end of the duration $T'_{int}$, because neither of the two integrations then corresponds to the presence of a reflected light pulse.

Consequently, an image of the points of the scene which lie at a distance $d_i$ and around this distance can be collected, so long as the synchronization between the sensor and the light source is such that the light pulse reflected by a point at the distance $d_i$ overlaps partially or fully the portion of duration $T'_{int}$ that does not coincide with the duration $T_{int}$.

More precisely, in the case of FIG. 5, the synchronization is such that the durations $T_{int}$ and $T'_{int}$ start at the same time, the end of the light pulse R_IMP reflected by the observed scene does not lie earlier than the end of the duration $T_{int}$, and the start of the light pulse reflected by the observed scene does not lie later than the end of the duration $T'_{int}$. Preferably, the reflected light pulse lies exactly in the middle between these two extreme positions in order to provide a signal indicating that, for the pixel in question, there is indeed a point of the scene at a distance $d_i$.

It is, however, also possible to envision that the integration durations $T_{int}$ and $T'_{int}$ start at different instants, $T'_{int}$ starting before $T_{int}$, and end at the same instant. In this case, the return of the light pulse coming from a reflection at a distance $d_i$ should overlap the part of duration $T'_{int}$ which starts before the start of the duration $T_{int}$.

These explanations are given with the assumption that the duration $T_{imp}$ of the light pulses is approximately equal to the duration $T'_{int}-T_{int}$, which is the best situation for obtaining high precision in determining the distance $d_i$ (in a distance measurement application) or in obtaining an image corresponding as precisely as possible to the distance $d_i$. This is because in this case the reflected pulse provides a signal peak when the point of the scene is precisely at the distance $d_i$, and it is even possible to detect a difference from this distance by observing the variation of the level of the signal, which is proportional to the distance difference over a difference corresponding to half the duration $T_{imp}$ (i.e. over a distance equal to $cT_{imp}/2$, c being the speed of light).

It is, however, possible for the duration $T_{imp}$ of the light pulse to be different from the value $T'_{int}-T_{int}$; in this case, the precision which can be expected is less and is directly associated with the difference $T_{imp}-(T'_{int}-T_{int})$ or $(T'_{int}-T_{int})-T_{imp}$; there is, as represented in FIG. 7, a curve of variation of the signal as a function of the distance which has a plateau, the duration of which corresponds to the absolute value of $[T_{imp}-(T'_{int}-T_{int})]$. On this plateau, the signal level does not change despite the variation of distance around $d_i$.

FIG. 8 furthermore represents a time diagram of operation according to the invention in the case in which the difference is formed between two full images obtained during two successive frames, with two light pulses, each corresponding to a respective frame. The light pulses should be identical in duration and in intensity in order for the difference between the images to be significant. The synchronization between the light pulses and the integration durations of the sensor satisfy the same principles as in the case of FIG. 5, but of course the coincidence between the return pulse R_IMP and the portion of integration duration $T'_{int}$ that does not coincide with the duration $T_{int}$ is of course to be interpreted by offsetting the duration $T_{int}$ by a value equal to the frame duration $T_r$.

It will be noted that, in the description above, it has been assumed that there was a single light pulse giving rise to an integration. The signal/noise ratio may, however, be improved by multiplying the number of pulses before reading the result of the integration of the charges generated by the various pulses. Then, for the same duration $t_i$, a pulse train is generated. This assumes that the durations $t_i$ which define the end of the integration time are accurately identical for the various pulses of the pulse train. The charges generated by the light are accumulated in the photodiodes after each pulse, and there is a TR signal (FIG. 2) for transfer to the storage node after each pulse, although the reading of the storage nodes by the signals $SHR_i$, $SHS_i$ only takes place after the last pulse of a pulse train, when all of the charges resulting from the pulses of the train have arrived.

The invention claimed is:

1. A method for imaging a scene with a very short integration time by using an image sensor comprising a matrix of pixels, each pixel comprising a photodiode and means for reading the charges accumulated by the photodiode during an integration duration, the matrix furthermore comprising sequencing means for establishing start and end instants of the integration duration, the method being characterized in that two images of the same scene are produced under identical light conditions, one of the images corresponding to integration of charges during a first time interval with a duration $T_{int}$ and corresponding to the even rows of the matrix, the other image corresponding to a second time interval with a duration $T'_{int}$ longer than $T_{int}$ and corresponding to the odd rows of the matrix, and a difference between these two images is established, representing an image integrated during a time interval $T'_{int}-T_{int}$, the difference being formed by the pixel-to-pixel difference between the luminances of the pixels of an odd row and the luminances of the pixels of an even row immediately adjacent.

2. The method as claimed in claim 1, wherein a controlled light source providing light pulses calibrated in duration and in intervals in synchronism with the operation of the sensor is used to illuminate the scene, and two images of the scene, illuminated by a light pulse, are produced, one of the images corresponding to integration of charges in the pixels of the even rows during the first time interval with a duration for $T_{int}$ and the other image corresponding to integration of charges in the pixels of the odd rows during the second time interval with a duration $T'_{int}$ longer than $T_{int}$.

3. The method as claimed in claim 2, wherein the observed scene lies at a determined distance $d_i$, and the synchronization between the light source and the sensor is such that the end of the light pulse reflected by the observed scene and corresponding to the image integrated during the duration $T_{int}$ fully or partially overlaps the portion of duration $T'_{int}$ that does not coincide with the duration $T_{int}$.

4. The method as claimed in claim 2, wherein the images are produced on the basis of a train of light pulses.

5. The method as claimed in claim 3, wherein the images are produced on the basis of a train of light pulses.

6. The method as claimed in claim 1, wherein the images are produced on the basis of a train of light pulses.

7. The method as claimed in claim 1, wherein the first time interval with a duration $T_{int}$ and the second time interval with a duration $T'_{int}$ are established on the basis of asynchronous logic circuits comprising CMOS inverters.

* * * * *